United States Patent
Fujita

(10) Patent No.: US 11,037,729 B2
(45) Date of Patent: Jun. 15, 2021

(54) CERAMIC ELECTRONIC COMPONENT AND METHOD FOR MANUFACTURING CERAMIC ELECTRONIC COMPONENT

(71) Applicant: Murata Manufacturing Co., Ltd., Nagaokakyo (JP)

(72) Inventor: Seiji Fujita, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/296,541

(22) Filed: Mar. 8, 2019

(65) Prior Publication Data

US 2019/0206624 A1  Jul. 4, 2019

Related U.S. Application Data

(63) Continuation of application No. PCT/JP2017/021005, filed on Jun. 6, 2017.

(30) Foreign Application Priority Data

Nov. 2, 2016 (JP) .............................. JP2016-215193

(51) Int. Cl.
*H01G 4/12* (2006.01)
*H01G 4/012* (2006.01)
(Continued)

(52) U.S. Cl.
CPC ........... *H01G 4/1227* (2013.01); *B32B 18/00* (2013.01); *C04B 35/195* (2013.01);
(Continued)

(58) Field of Classification Search
CPC ........ H01G 11/32; H01G 11/24; H01G 11/28; H01G 11/36; H01G 11/46; H01G 11/66; H01G 11/70; H01G 11/86; H01G 11/04; H01G 11/58; H01G 4/1227; H01G 4/012; H01G 4/30; Y02E 60/13; B32B 18/00;
(Continued)

(56) References Cited

U.S. PATENT DOCUMENTS

| 5,825,632 A | 10/1998 | Tanei et al. | |
|---|---|---|---|
| 2008/0280169 A1* | 11/2008 | Niu | H01M 4/926 429/409 |

(Continued)

FOREIGN PATENT DOCUMENTS

| JP | S59111345 A | 6/1984 |
|---|---|---|
| JP | 04290492 A * | 10/1992 |

(Continued)

OTHER PUBLICATIONS

International Search Report issued in PCT/JP2017/021005, dated Sep. 5, 2017.

(Continued)

*Primary Examiner* — Michael P McFadden
(74) *Attorney, Agent, or Firm* — Arent Fox LLP

(57) ABSTRACT

A ceramic electronic component that includes a plurality of ceramic layers which are stacked together, and an internal conductor layer disposed between two adjacent ceramic layers among the plurality of ceramic layers, and in which a ceramic layer that is adjacent to the internal conductor layer includes a plurality of pores.

18 Claims, 4 Drawing Sheets

(51) Int. Cl.
| | |
|---|---|
| *C04B 35/628* | (2006.01) |
| *C04B 35/462* | (2006.01) |
| *H01G 4/30* | (2006.01) |
| *C04B 35/195* | (2006.01) |
| *B32B 18/00* | (2006.01) |
| *C04B 35/626* | (2006.01) |
| *H05K 1/03* | (2006.01) |
| *C04B 38/00* | (2006.01) |
| *H05K 3/46* | (2006.01) |

(52) U.S. Cl.
CPC ...... *C04B 35/462* (2013.01); *C04B 35/62685* (2013.01); *C04B 35/62805* (2013.01); *C04B 35/62807* (2013.01); *C04B 35/62813* (2013.01); *C04B 35/62823* (2013.01); *C04B 35/62897* (2013.01); *C04B 38/00* (2013.01); *H01G 4/012* (2013.01); *H01G 4/30* (2013.01); *H05K 1/03* (2013.01); *H05K 3/46* (2013.01); *C04B 2235/3215* (2013.01); *C04B 2235/3229* (2013.01); *C04B 2235/3244* (2013.01); *C04B 2235/3262* (2013.01); *C04B 2237/341* (2013.01); *C04B 2237/62* (2013.01); *C04B 2237/704* (2013.01)

(58) Field of Classification Search
CPC ................ C04B 35/195; C04B 35/462; C04B 35/62685; C04B 35/62805; C04B 35/62807; C04B 35/62813; C04B 35/62823; C04B 35/62897; C04B 38/00; C04B 2235/3215; C04B 2235/3229; C04B 2235/3244; C04B 2235/3262; C04B 2237/341; C04B 2237/62; C04B 2237/704; H05K 1/03; H05K 3/46

See application file for complete search history.

(56) References Cited

U.S. PATENT DOCUMENTS

| | | | |
|---|---|---|---|
| 2014/0178740 A1* | 6/2014 | Ryu | ...................... H01M 2/145 429/144 |
| 2015/0311001 A1* | 10/2015 | Kato | ................... H01M 4/667 429/217 |
| 2017/0076868 A1* | 3/2017 | Noda | ...................... C03C 3/064 |

FOREIGN PATENT DOCUMENTS

| | | |
|---|---|---|
| JP | H04290492 A | 10/1992 |
| JP | H0567854 A | 3/1993 |
| JP | H05148009 A | 6/1993 |
| JP | H08333157 A | 12/1996 |
| JP | 2012004422 A | 1/2012 |
| JP | 2013008893 A | 1/2013 |
| JP | 2013229379 A | 11/2013 |

OTHER PUBLICATIONS

Written Opinion of the International Searching Authority issued in PCT/JP2017/021005, dated Sep. 5, 2017.

* cited by examiner

FIG. 4(a) 30 vol%
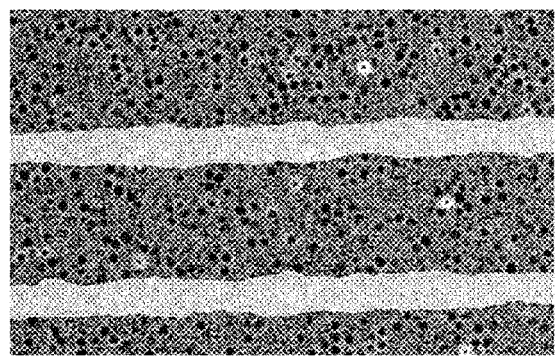
15kV ×1,000 10μm
FIG. 4(b)
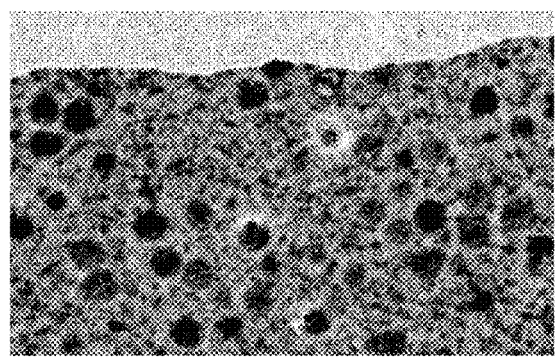
15kV ×3,300 5μm
FIG. 4(c)
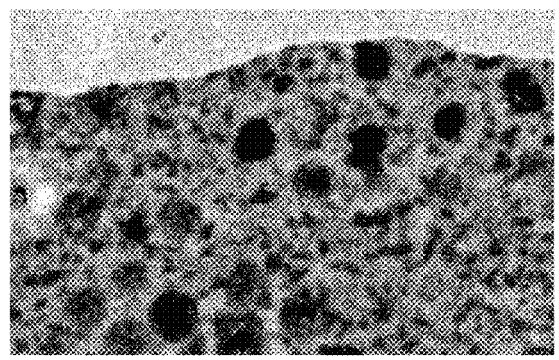
15kV ×5,000 5μm FIG. 5(a)      45vol%
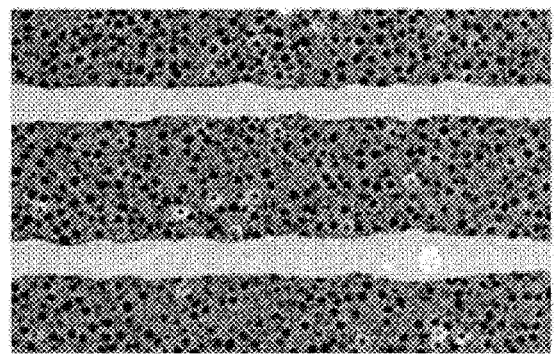
15kV   ×1,000   10μm
FIG. 5(b)
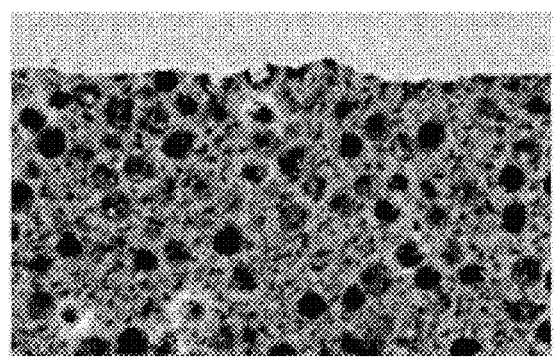
15kV   ×3,000   5μm
FIG. 5(c)
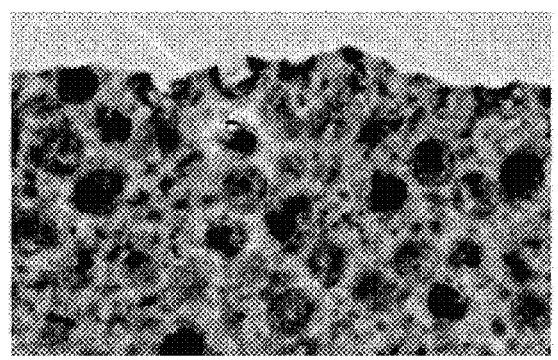
15kV   ×5,000   5μm

CERAMIC ELECTRONIC COMPONENT AND METHOD FOR MANUFACTURING CERAMIC ELECTRONIC COMPONENT

CROSS REFERENCE TO RELATED APPLICATIONS

The present application is a continuation of International application No. PCT/JP2017/021005, filed Jun. 6, 2017, which claims priority to Japanese Patent Application No. 2016-215193, filed Nov. 2, 2016, the entire contents of each of which are incorporated herein by reference.

FIELD OF THE INVENTION

The present invention relates to a ceramic electronic component and a method for manufacturing a ceramic electronic component.

BACKGROUND OF THE INVENTION

A ceramic electronic component, such as a multilayer ceramic substrate, is generally obtained by forming an internal conductor layer having a conductive pattern by applying a conductive paste by screen printing or the like onto a green sheet for forming a ceramic layer, then stacking a plurality of green sheets each having an internal conductor layer formed thereon to form a green multilayer body, and firing the green multilayer body.

In recent years, there has been a demand for ceramic electronic components having a low dielectric constant, and a method of decreasing the dielectric constant by forming pores in a ceramic layer is known. For example, Patent Document 1 discloses a method in which, by incorporating hollow silica into a green sheet, pores are formed in a ceramic layer after it has been fired. Furthermore, Patent Document 2 discloses a method in which, by incorporating resin powder, such as an acrylic resin, pores are formed in a ceramic layer when the resin powder portion is burned off.

Patent Document 1: Japanese Unexamined Patent Application Publication No. 5-67854

Patent Document 2: Japanese Unexamined Patent Application Publication No. 5-148009

SUMMARY OF THE INVENTION

However, in the method described in Patent Document 1, there is a concern that the hollow shape may collapse because of pressing stress when a plurality of green sheets are stacked and subjected to pressure bonding, resulting in no formation of pores. In particular, in a ceramic layer that is adjacent to a high strength layer, such as an internal conductor layer located between ceramic layers, the hollow shape tends to collapse.

Furthermore, in the method described in Patent Document 2, in the case where the ceramic layer contains a glass component, when components of an internal conductor layer diffuse into the ceramic layer adjacent to the internal conductor layer, the softening point of the ceramic layer is likely to decrease. As a result, there is a concern that the softened glass component may penetrate pores and the pores may be filled. Furthermore, in the method described in Patent Document 2, there is a concern that a region in which resin beads cohere locally may be generated, and since degreasing gas is emitted in large quantities from that region, a huge void may be formed, resulting in a decrease in insulation reliability.

As described above, in existing methods for forming pores in a ceramic layer, it is difficult to decrease the dielectric constant of a ceramic layer that is adjacent to an internal conductor layer.

The present invention has been made to solve the above-described problem. It is an object of the present invention to provide a ceramic electronic component in which a ceramic layer that is adjacent to an internal conductor layer has a low dielectric constant. It is another object of the present invention to provide a method for manufacturing the ceramic electronic component.

A ceramic electronic component according to an aspect of the present invention includes a plurality of ceramic layers which are stacked together, and an internal conductor layer disposed between two adjacent ceramic layers among the plurality of ceramic layers, and in which a ceramic layer that is adjacent to the internal conductor layer contains a plurality of pores.

In the ceramic electronic component according to the present invention, since a plurality of pores are provided in a ceramic layer that is adjacent to an internal conductor layer, in which it is difficult to form pores by existing techniques, the dielectric constant can be decreased.

In the ceramic electronic component according to an aspect of the present invention, preferably, each of the pores is provided inside a shell layer formed of an inorganic substance. Preferably, the inorganic substance constituting the shell layer contains at least $SiO_2$. As will be described later, in the ceramic electronic component according to the present invention, by using a pore-forming agent in which the circumference of each core portion made of a resin bead is covered with a shell layer formed of an inorganic substance and by burning off the resin bead during firing, a pore can be formed inside the shell layer. For example, in the case where pores are formed by the method described above in a ceramic layer containing a glass component, the inorganic substance constituting the shell layer forms a reaction layer at the interface with the ceramic layer, and because of the presence of the reaction layer, the softened glass component is unlikely to penetrate the pore, and thus pores can be maintained in the ceramic layer. Furthermore, when the circumference of each core is covered with a shell layer, a huge void created when a plurality of pores are joined together is unlikely to be formed. Therefore, each pore can be independently present.

In the ceramic electronic component according to an aspect of the present invention, preferably, the shell layer has a thickness of 0.5 μm or less. Even when the shell layer is thin with a thickness of 0.5 μm or less, pores can be maintained in the ceramic layer.

In the case where pores are formed by using a pore-forming agent in which the circumference of each core portion made of a resin bead is covered with a shell layer formed of an inorganic substance, the resin may sometimes remain as a residue inside the pores. Accordingly, in the ceramic electronic component according to the present invention, a resin residue may be present inside the pores.

In the ceramic electronic component according to an aspect of the present invention, from the viewpoint of decreasing the dielectric constant, preferably, the ceramic layer that is adjacent to the internal conductor layer has a porosity of 10% to 45%. The porosity is more preferably 30% to 40%.

In the ceramic electronic component according to an aspect of the present invention, preferably, the ceramic layer contains a glass component, and the glass component does not substantially contain boron. In the case where the glass component contained in the ceramic layer does not substantially contain boron, since the softening point of the glass component is unlikely to be decreased, the glass component is unlikely to penetrate pores, and the pores can be maintained in the ceramic layer.

In the ceramic electronic component according to an aspect of the present invention, preferably, the ceramic layer contains a glass component, and the glass component has a softening point of 800° C. to 950° C. In the case where the softening point of the glass component contained in the ceramic layer is within the range described above, since the glass component is unlikely to penetrate pores, the pores can be maintained in the ceramic layer.

A method for manufacturing a ceramic electronic component according to an aspect of the present invention includes mixing a ceramic powder, a pore-forming agent, a binder, a plasticizer, and a solvent to form a slurry, wherein the pore-forming agent has a core-shell structure including a core portion made of a resin bead which is not dissolved in the solvent and a shell layer which covers the circumference of the core portion and is formed of an inorganic substance; producing a green sheet from the slurry; forming an internal conductor layer having a conductive pattern on the green sheet; obtaining a green multilayer body by stacking and pressure-bonding a plurality of green sheets including the green sheet having the internal conductor layer formed thereon; and firing the green multilayer body.

In the method for manufacturing a ceramic electronic component according to an aspect of the present invention, pores are formed by using a pore-forming agent having a core-shell structure including a core portion made of a resin bead which is not dissolved in the solvent and a shell layer which covers the circumference of the core portion and is formed of an inorganic substance. Therefore, for example, in the case where pores are formed in a ceramic layer containing a glass component, unlike the method described in Patent Document 1 or 2, in the ceramic layer that is adjacent to an internal conductor layer, penetration of the softened glass component into pores can be suppressed. As a result, it is possible to manufacture a ceramic electronic component having a low dielectric constant. Furthermore, since the circumference of each pore is covered with a shell layer, a huge void in which a plurality of pores are joined together is unlikely to be formed. As a result, it is possible to manufacture a ceramic electronic component having high insulation reliability.

In the method for manufacturing a ceramic electronic component according to an aspect of the present invention, preferably, the inorganic substance constituting the shell layer is at least one selected from the group consisting of $SiO_2$, $AlO_3$, $ZrO_2$, $TiO_2$, and $MgO$.

In the method for manufacturing a ceramic electronic component according to an aspect of the present invention, preferably, the shell layer has a thickness of 0.5 μm or less. Even when the shell layer is thin with a thickness of 0.5 μm or less, pores can be maintained in the ceramic layer.

In the method for manufacturing a ceramic electronic component according to an aspect of the present invention, preferably, the resin bead constituting the core portion contains at least one selected from the group consisting of acrylic resins and divinylbenzene resins. These resins have a high heat resistant temperature, and large portions thereof are burned off at temperatures up to 500° C. during firing, thus being preferable.

In the method for manufacturing a ceramic electronic component according to an aspect of the present invention, preferably, the ceramic powder contains a glass component, and the glass component does not substantially contain boron. In the case where the glass component contained in the ceramic powder does not substantially contain boron, since the softening point of the glass component is unlikely to be decreased, the glass component is unlikely to penetrate pores, and the pores can be maintained in the ceramic layer.

In the method for manufacturing a ceramic electronic component according to an aspect of the present invention, preferably, the ceramic powder contains a glass component, and the glass component has a softening point of 800° C. or higher and 950° C. or lower. In the case where the softening point of the glass component contained in the ceramic powder is within the range described above, since the glass component is unlikely to penetrate pores, the pores can be maintained in the ceramic layer.

According to aspects of the present invention, it is possible to provide a ceramic electronic component in which a ceramic layer that is adjacent to an internal conductor layer has a low dielectric constant.

BRIEF DESCRIPTION OF THE DRAWINGS

FIGS. 4(a), 4(b), and 4(c) are cross-sectional SEM photographs of a multilayer ceramic substrate of Example 4.

FIGS. 5(a), 5(b), and 5(c) are cross-sectional SEM photographs of a multilayer ceramic substrate of Example 6.

DETAILED DESCRIPTION OF THE PREFERRED EMBODIMENTS

Descriptions will be made below on a ceramic electronic component and a method for manufacturing a ceramic electronic component according to the present invention. However, the present invention is not limited to the embodiments described below, and can be appropriately changed within the range not departing from the gist of the present invention. Note that a combination of two or more preferred embodiments of the present invention described below is also covered by the present invention.

[Ceramic Electronic Component]

A multilayer ceramic substrate will be described below as an embodiment of the ceramic electronic component according to the present invention. However, the ceramic electronic component according to the present invention is not limited to multilayer ceramic substrates, but can be applied to chip components to be mounted on multilayer ceramic substrates, e.g., multilayer ceramic capacitors, multilayer inductors, or ceramic electronic components such as multilayer ceramic filters obtained by integrally firing these components. For example, in the case where the ceramic electronic component according to the present invention is applied to a multilayer ceramic capacitor, a dielectric layer constituting the multilayer ceramic capacitor corresponds to a ceramic layer, and an inner electrode corresponds to an internal conductor layer.

Figure 1A:
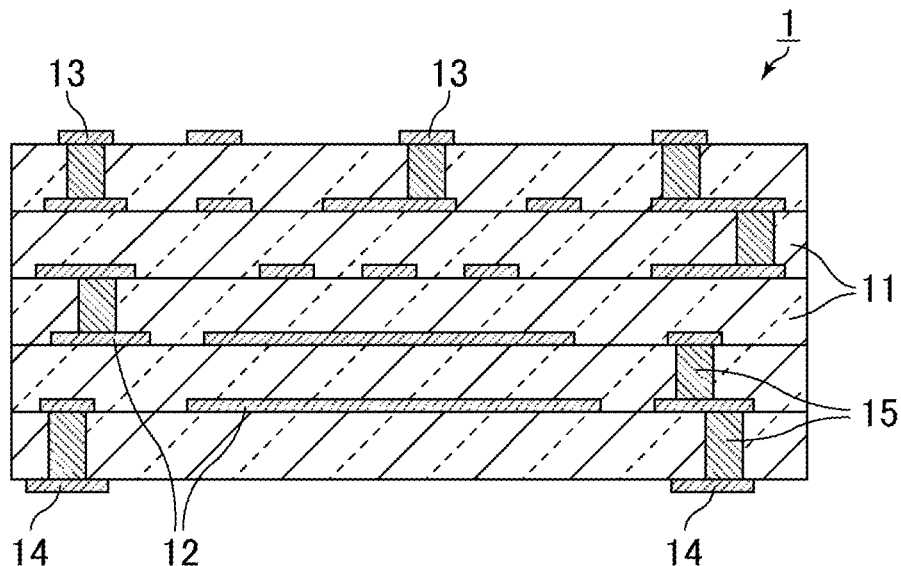
FIG. 1(a) is a cross-sectional view schematically showing an example of a multilayer ceramic substrate according to an embodiment of a ceramic electronic component of the present invention.
Figure 1B:
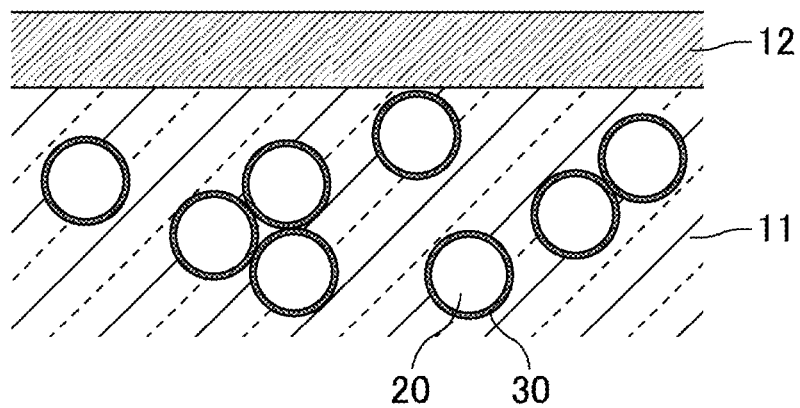
FIG. 1(b) is an enlarged cross-sectional view schematically showing a ceramic layer constituting the multilayer ceramic substrate shown in FIG. 1(a).

FIG. 1(*a*) is a cross-sectional view schematically showing an example of a multilayer ceramic substrate according to an embodiment of a ceramic electronic component of the present invention. In a multilayer ceramic substrate 1 shown FIG. 1(*a*), a plurality of structures are stacked, each structure including a ceramic layer 11 and an internal conductor layer 12. Internal conductor layers 12 are disposed substantially parallel to ceramic layers 11.

An internal conductor layer 12 is disposed as an interconnection conductor between ceramic layers 11. The multilayer ceramic substrate 1 includes, as interconnection conductors other than the internal conductor layers 12, external conductor layers 13 which are provided on one principal surface of the multilayer ceramic substrate 1, external conductor layers 14 provided on the other principal surface of the multilayer ceramic substrate 1, and via-hole conductors 15 which are electrically connected to any of the internal conductor layers 12, the external conductor layers 13, and the external conductor layers 14 and are provided so as to pass through any of the ceramic layers 11 in the thickness direction. The interconnection conductors preferably contain, as a main component, Ag, Cu, Au, a Ag—Pd alloy, or a Ag—Pt alloy, and more preferably contain, as a main component, Ag or Cu.

Chip components are mounted on the one principal surface of the multilayer ceramic substrate 1 in a state of being electrically connected to the external conductor layers 13. The external conductor layers 14 provided on the other principal surface of the multilayer ceramic substrate 1 are used as devices for electrical connection when the multilayer ceramic substrate 1 mounted with chip components is mounted on a motherboard.

FIG. 1(*b*) is an enlarged cross-sectional view schematically showing a ceramic layer constituting the multilayer ceramic substrate shown in FIG. 1(*a*). As shown in FIG. 1(*b*), a ceramic layer 11 that is adjacent to an internal conductor layer 12 contains a plurality of pores 20. In FIG. 1(*b*), each of the pores 20 is provided inside a shell layer 30 formed of an inorganic substance.

As described above, in the ceramic electronic component according to the present invention, a ceramic layer that is adjacent to an internal conductor layer contains a plurality of pores. However, in the ceramic electronic component according to the present invention, in the case where there are a plurality of ceramic layers that are adjacent to an internal conductor layer, there may be a ceramic layer not provided with pores. Furthermore, a ceramic layer that is not adjacent to an internal conductor layer may or may not be provided with the pores.

In the ceramic electronic component according to the present invention, an average pore size is not particularly limited, but is preferably 0.1 μm to 10 μm, more preferably 0.1 μm to 8 μm, still more preferably 0.1 μm to 7 μm, and particularly preferably 0.1 μm to 5 μm. Note that the average pore size means an average diameter obtained by SEM (scanning electron microscope) observation of a cross section of a ceramic layer that is adjacent to an internal conductor layer.

In the ceramic electronic component according to the present invention, a porosity of a ceramic layer that is adjacent to an internal conductor layer is not particularly limited, but is preferably 10% to 45% and more preferably 30% to 40%. Note that the "porosity of a ceramic layer that is adjacent to an internal conductor layer" means a porosity of a region of the ceramic layer with a thickness of 30 μm that is close to the internal conductor layer. The porosity can be obtained from a pore area ratio relative to the SEM observation area in a cross section of a ceramic layer that is adjacent to an internal conductor layer.

In the ceramic electronic component according to the present invention, as shown in FIG. 1(*b*), preferably, the circumference of each of the pores is covered with a shell layer formed of an inorganic substance, and each of the pores is provided inside the shell layer. However, there may be a pore which is not provided inside a shell layer. For example, in the case where a ceramic layer contains a glass component, when each of pores is provided inside a shell layer formed of an inorganic substance, the softened glass component is unlikely to penetrate the pore, and thus the pores can be maintained in the ceramic layer. Furthermore, a huge void in which a plurality of pores are joined together is unlikely to be formed. Therefore, each pore can be independently present.

In the case where pores are formed by using a pore-forming agent in which the circumference of a core portion made of a resin bead is covered with a shell layer formed of an inorganic substance, it is considered that the shell layer around the pore is formed of a reaction product between the glass component contained in the ceramic layer and the inorganic substance contained in the pore-forming agent. The inorganic substance constituting the shell layer is preferably at least one selected from the group consisting of $SiO_2$, $Al_2O_3$, $ZrO_2$, $TiO_2$, and MgO, and more preferably at least one selected from the group consisting of $SiO_2$ and $Al_2O_3$. In particular, from the viewpoint of decreasing the dielectric constant, preferably, the inorganic substance constituting the shell layer around the pore contains at least $SiO_2$.

In the ceramic electronic component according to the present invention, the thickness of the shell layer around the pore is not particularly limited, but is preferably 0.03 μm to 0.5 μm, and more preferably 0.05 μm to 0.2 μm. Note that the thickness of the shell layer around the pore can be obtained by SEM (scanning electron microscope) observation of a cross section of a ceramic layer that is adjacent to an internal conductor layer.

In the case where pores are formed by using a pore-forming agent in which the circumference of each core portion made of a resin bead is covered with a shell layer formed of an inorganic substance, the resin may sometimes remain as a residue inside the pores. Accordingly, in the ceramic electronic component according to the present invention, a resin residue may be present inside the pores. Note that the presence of a resin residue inside the pores can be confirmed, for example, by using a carbon/sulfur analyzer, in which a sample is superheated to a high temperature in an oxygen stream and subjected to complete combustion, and then the C (carbon) content is measured.

In the ceramic electronic component according to the present invention, preferably, the ceramic layer contains a low-temperature sinterable ceramic material. The term "low-temperature sinterable ceramic material" means a ceramic material that can be sintered at a firing temperature of 1,000° C. or lower and can be co-fired with Ag or Cu.

Examples of the low-temperature sinterable ceramic material contained in the ceramic layer include a glass composite-based low-temperature sinterable ceramic material obtained by mixing borosilicate glass with a ceramic material, such as quartz, alumina, or forsterite; a crystallized glass-based low-temperature sinterable ceramic material obtained by using a $ZnO$—$MgO$—$Al_2O_3$—$SiO_2$-based crystallized glass; and a non-glass low-temperature sinterable ceramic material obtained by using a $BaO$—$Al_2O_3$—

SiO$_2$-based ceramic material, Al$_2$O$_3$—CaO—SiO$_2$—MgO—B$_2$O$_3$-based ceramic material, or the like.

In the ceramic electronic component according to the present invention, preferably, the ceramic layer contains a glass component. In this case, from the viewpoint of increasing the softening point of the glass component contained in the ceramic layer, preferably, the glass component contained in the ceramic layer does not substantially contain boron. For example, preferably, the glass component contained in the ceramic layer contains SiO$_2$, BaO, and Al$_2$O$_3$. In this case, preferably, the glass component contained in the ceramic layer contains, as main components, 47% to 67% by weight of SiO$_2$, 21% to 41% by weight of BaO, and 10% to 18% by weight of Al$_2$O$_3$, and further contains, as a sintering aid component, 2.5% to 5.5% by weight of MnO.

In the ceramic electronic component according to the present invention, in the case where the ceramic layer contains a glass component, the softening point of the glass component contained in the ceramic layer is not particularly limited, but is preferably 800° C. to 950° C., and more preferably 830° C. to 930° C. Note that the softening point of the glass component contained in the ceramic layer can be obtained by thermomechanical analysis (TMA).

[Method for Manufacturing Ceramic Electronic Component]

As an embodiment of a method for manufacturing a ceramic electronic component of the present invention, a preferred method for manufacturing a multilayer ceramic substrate 1 shown in FIG. 1(a) will be described.

First, a green sheet for forming a ceramic layer is produced. The green sheet can be produced, for example, by preparing a ceramic slurry by mixing a ceramic powder, such as a low-temperature sinterable ceramic material, serving as a main component, a pore-forming agent, a binder, a plasticizer, a solvent, and the like in predetermined amounts, and then forming the resulting ceramic slurry into a sheet shape by a doctor blade method or the like.

In the method for manufacturing a ceramic electronic component according to the present invention, as the ceramic powder contained in the ceramic slurry, for example, the low-temperature sinterable ceramic material described herein above or the like can be used.

In the method for manufacturing a ceramic electronic component according to the present invention, preferably, the ceramic powder contains a glass component. In this case, preferably, the glass component contained in the ceramic powder does not substantially contain boron. For example, preferably, the glass component contained in the ceramic powder contains SiO$_2$, BaO, and Al$_2$O$_3$. In this case, preferably, the glass component contained in the ceramic powder contains, as main components, 47% to 67% by weight of SiO$_2$, 21% to 41% by weight of BaO, and 10% to 18% by weight of Al$_2$O$_3$, and further contains, as a sintering aid component, 2.5% to 5.5% by weight of MnO.

In the method for manufacturing a ceramic electronic component according to the present invention, in the case where the ceramic powder contains a glass component, the softening point of the glass component contained in the ceramic powder is not particularly limited, but is preferably 800° C. to 950° C., and more preferably 830° C. to 930° C. Note that the softening point of the glass component contained in the ceramic powder can be obtained by thermomechanical analysis (TMA).

As the binder contained in the ceramic slurry, for example, an organic binder, such as a butyral resin (polyvinyl butyral), acrylic resin, or methacrylic resin, can be used. As the plasticizer, for example, di-n-butylphthalate or the like can be used. As the solvent, for example, toluene, an alcohol such as isopropyl alcohol, or the like can be used.

Figure 2:
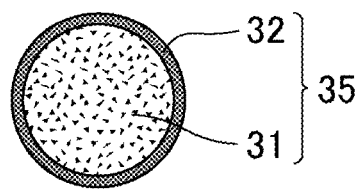
FIG. 2 is a cross-sectional view schematically showing an example of a pore-forming agent.

FIG. 2 is a cross-sectional view schematically showing an example of a pore-forming agent. As shown in FIG. 2, a pore-forming agent 35 contained in the ceramic slurry has a core-shell structure including a core portion 31 made of a resin bead and a shell layer 32 which covers the circumference of the core portion 31 and is formed of an inorganic substance. The pore-forming agent has a substantially spherical shape.

In the method for manufacturing a ceramic electronic component according to the present invention, the material of the resin bead constituting the core portion is not particularly limited as long as it is not dissolved in the solvent contained in the ceramic slurry, and examples thereof include acrylic resins, divinylbenzene resins, and polyimide resins. One or two or more of these resins may be used. Since a resin which has a high heat resistant temperature and whose large portion is burned off at temperatures up to 500° C. during firing is preferable, preferably, the resin bead constituting the core portion contains at least one selected from the group consisting of acrylic resins and divinylbenzene resins, and more preferably, contains a divinylbenzene resin.

The term "acrylic resin" refers to a homopolymer or copolymer of (meth)acrylic acid, (meth)acrylic ester, (meth)acrylamide, or (meth)acrylonitrile. One or two or more acrylic resins may be used. Note that the term "(meth)acrylic acid" means acrylic acid and/or methacrylic acid, and the same applies hereafter. Examples of (meth)acrylic ester include methyl (meth)acrylate, ethyl (meth)acrylate, butyl (meth)acrylate, lauryl (meth)acrylate, stearyl (meth)acrylate, 2-hydroxyethyl (meth)acrylate, 2-hydroxypropyl (meth)acrylate, 2-dimethylaminoethyl (meth)acrylate, and glycidyl (meth)acrylate. Among these acrylic resins, a poly (methyl methacrylate) resin (PMMA) is preferable.

The term "divinylbenzene resin" refers to a homopolymer or copolymer of a divinylbenzene monomer. One or two or more divinylbenzene resins may be used. Examples of the divinylbenzene monomer include divinylbenzene, chlorodivinylbenzene, and hydroxydivinylbenzene. Furthermore, examples of a monomer to be copolymerized with the divinylbenzene monomer include styrene monomers, such as styrene, o-methyl styrene, m-methyl styrene, p-methyl styrene, divinylbenzene, α-methyl styrene, o-chlorostyrene, p-chlorostyrene, chloromethylstyrene, o-hydroxystyrene, m-hydroxystyrene, and p-hydroxystyrene. Among these divinylbenzene resins, polydivinylbenzene is preferable.

The particle size D50 of the resin beads constituting the core portions is not particularly limited, but is preferably 0.5 μm to 7 μm, and more preferably 0.8 μm to 5 μm. Furthermore, the particle size D99 of the resin beads constituting the core portions is not particularly limited, but is preferably 0.8 μm to 10 μm, and more preferably 1.0 μm to 8 μm. Note that the particle size D50 represents a particle size where the ratio of the number of particles having a particle size equal to or less than this particle size to the number of all particles is 50%, and the particle size D99 represents a particle size where the ratio of the number of particles having a particle size equal to or less than this particle size to the number of all particles is 99%. The D50 and D99 can be obtained, for example, using a particle size distribution analyzer MT3300-EX manufactured by MicrotracBEL Corp., by measuring a particle size distribution in a range of 0.02 μm to 1,400 μm by a laser diffraction and scattering method.

In the method for manufacturing a ceramic electronic component according to the present invention, the inorganic substance constituting the shell layer is not particularly limited, and, for example, is a metal oxide, such as $SiO_2$, $Al_2O_3$, $ZrO_2$, $TiO_2$, or MgO. One or two or more of these inorganic substances may be used. The inorganic substance constituting the shell layer is preferably at least one selected from the group consisting of $SiO_2$, $Al_2O_3$, $ZrO_2$, $TiO_2$, and MgO, and more preferably at least one selected from the group consisting of $SiO_2$ and $Al_2O_3$. In particular, from the viewpoint of decreasing the dielectric constant, preferably, the inorganic substance constituting the shell layer contains at least $SiO_2$.

The thickness of the shell layer around the core portion is not particularly limited, but is preferably 0.03 μm to 0.5 μm, and more preferably 0.05 μm to 0.2 μm. Note that the thickness of the shell layer around the core portion can be obtained by a method in which a powder having a core-shell structure is mixed into a mixed solution of a resin and a curing agent, the resin is cured, then polishing is performed by a predetermined amount, and a cross section of particles after polishing is observed.

The pore-forming agent can be produced by coating resin beads with an inorganic substance. As a coating method, dry physical adsorption may be used or wet chemical adsorption using a sol-gel process may be used. In chemical adsorption, a dense shell layer is likely to be formed, which is preferable.

In the method for manufacturing a ceramic electronic component according to the present invention, the amount of addition of the pore-forming agent is preferably 10% to 50% by volume, and more preferably 20% to 45% by volume, relative to the total volume.

Next, an internal conductor layer having a conductive pattern is formed on predetermined green sheets. As necessary, via-hole conductors and external conductor layers are provided on certain green sheets. Then, a green multilayer body is obtained by stacking and pressure-bonding a plurality of green sheets including the green sheets having the internal conductor layer formed thereon.

Interconnection conductors, such as internal conductor layers, can be formed by application of a conductive paste. At this stage, preferably, interconnection conductors, such as internal conductor layers, are formed of an unsintered conductive paste. Note that the order of formation of interconnection conductors is not particularly limited. After interconnection conductors are formed on predetermined green sheets, the individual green sheets may be stacked together, or while forming interconnection conductors on green sheets, the individual green sheets may be stacked together. Internal conductor layers and external conductor layers can be formed, for example, by applying a conductive paste by screen printing onto green sheets. On the other hand, via-hole conductors can be formed, for example, by providing through-holes in green sheets, and filling the through-holes with a conductive paste. As the conductive paste for forming the interconnection conductors, a paste containing the conductive material, such as Cu, described above, an organic binder, a solvent, and the like can be suitably used.

Subsequently, the green multilayer body is fired. Thus, the green sheets are sintered to form ceramic layers.

During firing, the resin bead constituting each core portion of the pore-forming agent is burned off at temperatures up to 500° C. and therefore, the resin bead portion becomes a pore. On the other hand, the shell layer formed of an inorganic substance, such as $SiO_2$, is left while maintaining its shape. For example, in the case where the ceramic layer contains a glass component, it is considered that the inorganic substance constituting the shell layer forms a reaction layer at the interface with the ceramic layer, and because of the presence of the reaction layer, the softened glass component is unlikely to penetrate the pore, and thus the pore can be maintained in the ceramic layer. Furthermore, when the circumference of each core is covered with a shell layer, a huge void in which a plurality of pores are joined together is unlikely to be formed. Therefore, each pore can be independently present.

As a result, it is possible to obtain a multilayer ceramic substrate (ceramic electronic component) which includes a plurality of ceramic layers which are stacked together, and an internal conductor layer disposed between two adjacent ceramic layers, in which a ceramic layer that is adjacent to the internal conductor layer contains a plurality of pores.

In the case where the green sheet contains a low-temperature sinterable ceramic material, for example, a firing temperature of 1,000° C. or lower is used. The firing temperature needs to be equal to or higher than the temperature at which each resin bead is burned off and, for example, is preferably 500° C. or higher. Furthermore, the firing atmosphere is not particularly limited, but firing is preferably performed in a low-oxygen atmosphere. The term "low-oxygen atmosphere" means an atmosphere whose oxygen partial pressure is lower than that of the air. Examples thereof include an inert gas atmosphere, such as a nitrogen atmosphere or argon atmosphere, an atmosphere obtained by mixing an inert gas, such as nitrogen, with the air, and a vacuum atmosphere. Furthermore, firing may be performed in a mixed gas atmosphere of nitrogen and hydrogen.

Furthermore, green sheets for constraint containing an inorganic material ($Al_2O_3$ or the like) that are not substantially sintered at the temperature at which the green sheets constituting the green multilayer body are sintered may be prepared, and the green multilayer body may be fired in a state in which the green sheets for constraint are disposed on both principal surfaces of the green multilayer body. In this case, since the green sheets for constraint are not substantially sintered during firing, shrinkage does not occur, and the green sheets for constraint function to suppress shrinkage in the principal surface direction with respect to the green multilayer body. As a result, the dimensional accuracy of the multilayer ceramic substrate can be enhanced.

EXAMPLES

Examples which more specifically disclose the ceramic electronic component according to the present invention will be shown below. Note that the present invention is not limited to these examples only.

(Preparation of Pore-Forming Agent)

As shown in Table 1, pore-forming agents having a core-shell structure including a core portion made of a resin bead and a shell layer which covers the circumference of the core portion were prepared. In Table 1, the divinylbenzene resin represents a homopolymer or copolymer of a divinylbenzene monomer having an OH group, and PMMA represents a poly(methyl methacrylate) resin.

TABLE 1

| | Core portion | | | Shell layer | |
| --- | --- | --- | --- | --- | --- |
| | | | | Coating | |
| | Resin beads | D50 [μm] | D99 [μm] | Inorganic substance | thickness [μm] |
| Example 1 | Divinylbenzene resin | 3.0 | 3.7 | $SiO_2$ | 0.15 |
| Example 2 | Divinylbenzene resin | 3.0 | 3.7 | $Al_2O_3$ | 0.15 |
| Example 3 | Divinylbenzene resin | 3.0 | 3.7 | $ZrO_2$ | 0.15 |
| Example 4 | Divinylbenzene resin | 3.0 | 3.7 | $SiO_2$ | 0.15 |
| Example 5 | Divinylbenzene resin | 3.0 | 3.7 | $SiO_2$ | 0.15 |
| Example 6 | Divinylbenzene resin | 3.0 | 3.7 | $SiO_2$ | 0.15 |
| Example 7 | Divinylbenzene resin | 3.0 | 3.7 | $SiO_2$ | 0.15 |
| Example 8 | PMMA | 4.8 | 10.1 | $SiO_2$ | 0.05 |
| Example 9 | PMMA | 1.0 | 2.8 | $SiO_2$ | 0.05 |
| Comparative Example 1 | — | — | — | — | — |
| Comparative Example 2 | Divinylbenzene resin | 3.0 | 4.1 | None | None |
| Comparative Example 3 | PMMA | 4.0 | 6.2 | None | None |

(Production of Multilayer Ceramic Substrate)

As starting materials, powders of $SiO_2$, $BaCO_3$, $Al_2O_3$, $ZrO_2$, $MnCO_3$, and $CeO_2$ were prepared. First, powders of $SiO_2$, $BaCO_3$, $Al_2O_3$, and $ZrO_2$ were formulated such that, after firing, the amount of $SiO_2$ was 57.0% by weight, the amount of BaO was 31.0% by weight, the amount of $Al_2O_3$ was 12.0% by weight, and the amount of $ZrO_2$ was 0.5 parts by weight relative to 100 parts by weight of the total amount of $SiO_2$, BaO, and $Al_2O_3$, and then, wet mixing was performed using pure water in a ball mill. After mixing, by performing an evaporation and drying step, a mixed powder was obtained. The mixed powder was calcined, in the air, at a temperature of 840° C. for two hours, to thereby obtain a calcined powder. Powders of $MnCO_3$ and $CeO_2$ were added to the calcined powder such that, after firing, the amount of MnO was 4.0 parts by weight and the amount of $CeO_2$ was 3.0 parts by weight relative to 100 parts by weight of the total amount of $SiO_2$, BaO, and $Al_2O_3$, and then, wet mixing was performed using an organic solvent in a ball mill.

After wet mixing, the pore-forming agent, together with a butyral resin serving as a binder and dioctyl phthalate (DOP) serving as a plasticizer, was added in an amount of 20% to 50% by volume relative to the total volume as shown in Table 2, followed by mixing, to thereby obtain a ceramic slurry.

The ceramic slurry was subjected to defoaming, and then, a green sheet with a thickness of 30 μm was formed by a doctor blade method.

By applying a Cu paste by screen printing onto the resulting green sheet, a predetermined conductive pattern was formed. A plurality of green sheets were stacked and pressure-bonded with pressure being applied from above and below, and thus, a green multilayer body was produced. By firing the green multilayer body subjected to pressure bonding, in a reducing atmosphere, at a temperature of 980° C. for one hour, a multilayer ceramic substrate for evaluation was obtained.

Figure 3:
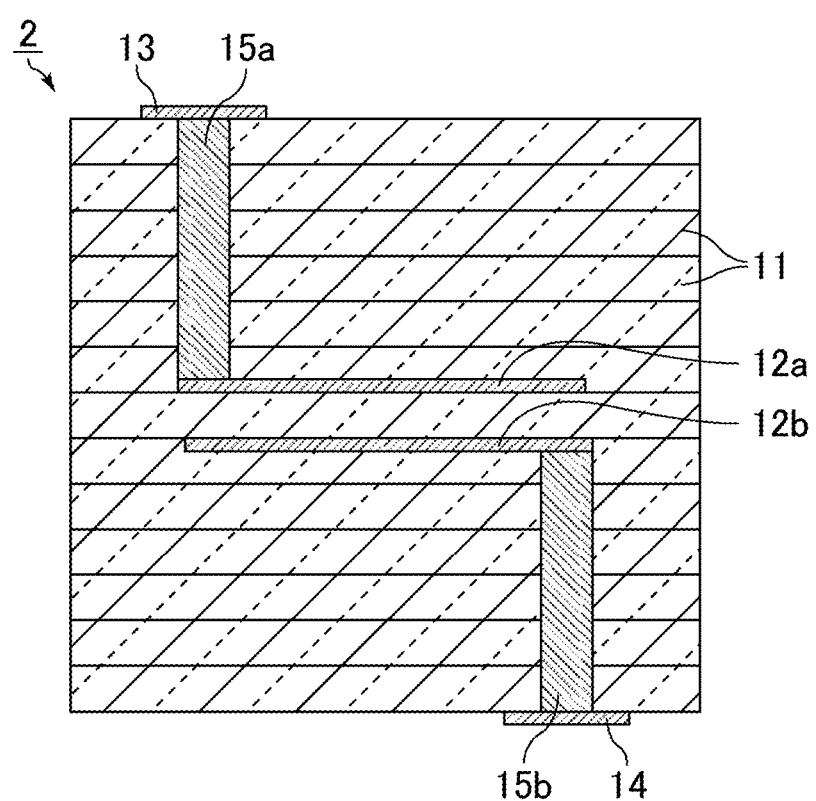
FIG. 3 is a cross-sectional view schematically showing a multilayer ceramic substrate for evaluation.

FIG. 3 is a cross-sectional view schematically showing a multilayer ceramic substrate for evaluation. Two via-hole conductors 15a and 15b are formed in a multilayer ceramic substrate for evaluation 2. The via-hole conductor 15a is connected to an external conductor layer 13 formed on a ceramic layer 11 located on the one principal surface side and to an internal conductor layer 12a formed between ceramic layers 11. The via-hole conductor 15b is connected to an external conductor layer 14 formed on a ceramic layer 11 located on the other principal surface side and to an internal conductor layer 12b formed between ceramic layers 11. The internal conductor layer 12a connected to the via-hole conductor 15a is separated from the internal conductor layer 12b connected to the via-hole conductor 15b by a distance corresponding to a thickness of one ceramic layer 11.

(Evaluation of Multilayer Ceramic Substrate)

Regarding the multilayer ceramic substrate for evaluation, "porosity", "average pore size", "maximum pore size", "dielectric constant", and "insulation reliability" were evaluated.

The "porosity", "average pore size", and "maximum pore size" were obtained by SEM observation of a cross section of a multilayer ceramic substrate. Specifically, a fired multilayer ceramic substrate was cut into a predetermined size, the cut piece was embedded in an epoxy resin mixed with a curing agent, followed by curing, then a cross section was obtained by polishing, and the cross section was observed by SEM.

With respect to the "dielectric constant", a dielectric constant at 6 GHz was obtained by a perturbation method.

With respect to the "insulation reliability", an insulation reliability test was carried out using, as electrode terminals, external conductor layers disposed on the front and back sides of a multilayer ceramic substrate for evaluation. In a pressure cooker test, a DC voltage of 50 V was applied, and insulation resistance after 200 hours was checked. Test conditions were as follows: 121° C.-85% RH. Leakage current was measured after a DC voltage of 50 V was applied for 60 seconds to samples subjected to the pressure cooker test. Samples which indicated LogIR≥10 were evaluated to be ○ (good), and samples which indicated LogIR<10 were evaluated to be x (poor). Note that the thickness of a ceramic layer sandwiched between internal conductor layers for which insulation resistance was measured was 15 μm, as the thickness after firing in the case where internal conductor layers were not provided.

The evaluation results are shown in Table 2. Furthermore, FIGS. 4(a), 4(b), and 4(c) are cross-sectional SEM photographs of a multilayer ceramic substrate of Example 4, and FIGS. 5(a), 5(b), and 5(c) are cross-sectional SEM photographs of a multilayer ceramic substrate of Example 6. FIGS. 4(a) and 5(a) are cross-sectional SEM photographs with a magnification of 1,000 times, FIG. 4(b) is a cross-sectional SEM photograph with a magnification of 3,300 times, FIG. 5(b) is a cross-sectional SEM photograph with a magnification of 3,000 times, and FIGS. 4(c) and 5(c) are cross-sectional SEM photographs with a magnification of 5,000 times.

TABLE 2

| | Pore-forming agent Amount of addition [vol %] | Pores | | | | Insulation reliability | |
| --- | --- | --- | --- | --- | --- | --- | --- |
| | | Porosity [%] | Average size [μm] | Maximum size [μm] | Dielectric constant | LogIR [Ω] | Evaluation |
| Example 1 | 20 | 12 | 2.6 | 4.0 | 6.2 | 11 | ○ |
| Example 2 | 20 | 11 | 2.6 | 4.1 | 6.6 | 11 | ○ |
| Example 3 | 20 | 11 | 2.6 | 4.2 | 6.7 | 11 | ○ |
| Example 4 | 30 | 22 | 2.6 | 4.2 | 5.5 | 11 | ○ |
| Example 5 | 40 | 31 | 2.6 | 4.1 | 5.0 | 11 | ○ |
| Example 6 | 45 | 37 | 2.6 | 4.3 | 4.5 | 11 | ○ |
| Example 7 | 50 | 43 | 2.6 | 6.2 | 3.9 | 7 | x |
| Example 8 | 45 | 35 | 4.4 | 13.1 | 4.7 | 11 | ○ |
| Example 9 | 45 | 34 | 0.8 | 2.5 | 4.6 | 11 | ○ |
| Comparative Example 1 | None | 1 | 0.5 | 3.0 | 7.0 | 11 | ○ |
| Comparative Example 2 | 45 | 21 | 2.0 | 18.0 | 6.0 | 5 | x |
| Comparative Example 3 | 45 | 19 | 2.5 | 24.0 | 5.9 | 5 | x |

In the multilayer ceramic substrates of Examples 1 to 3, 20% by volume of a pore-forming agent in which divinylbenzene resin beads are coated with $SiO_2$, $Al_2O_3$, or $ZrO_2$ is added relative to the total volume. In each of Examples 1 to 3, huge voids are not formed in the multilayer ceramic substrate, and pores having a diameter close to that of the resin beads added can be formed. Furthermore, comparison among Examples 1 to 3 shows that in the case where the purpose of pore formation is to decrease the dielectric constant, $SiO_2$ is preferable as the material for the shell layer.

In the multilayer ceramic substrates of Examples 1 and 4 to 7, 20% to 50% by volume of a pore-forming agent in which divinylbenzene resin beads are coated with $SiO_2$ is added relative to the total volume. In each of Examples 1 and 4 to 7, it has been confirmed that occurrence of huge voids due to cohesion of resin beads can be suppressed, and pores having a diameter close to that of the resin beads added can be formed. Comparison among Examples 1 and 4 to 7 shows that the increase in the amount of addition of the pore-forming agent contributes to a decrease in the dielectric constant. However, as in Example 7, in the case where the amount of addition is 50% by volume, insulation properties as the substrate are degraded under the influence of an excessive increase in the porosity. Therefore, in the case where insulation properties are required, preferably, the amount of addition of the pore-forming agent is 45% by volume or less. On the other hand, in order to decrease the dielectric constant, preferably, the amount of addition of the pore-forming agent is 20% by volume or more.

In the multilayer ceramic substrates of Examples 8 and 9, 45% by volume of a pore-forming agent in which poly(methyl methacrylate) [PMMA] resin beads are coated with $SiO_2$ is added relative to the total volume. In the case where PMMA is used, it has also been confirmed that occurrence of huge voids due to cohesion of resin beads can be suppressed, and pores having a diameter close to that of the resin beads added can be formed. Therefore, it is considered that this effectively contributes to a decrease in the dielectric constant.

In the multilayer ceramic substrate of Comparative Example 1, a pore-forming agent is not added. Furthermore, in the multilayer ceramic substrate of Comparative Example 2, divinylbenzene resin beads which are not coated with an inorganic substance are added as a pore-forming agent, and in the multilayer ceramic substrate of Comparative Example 3, PMMA resin beads which are not coated with an inorganic substance are added as a pore-forming agent. As is evident from Comparative Example 1, in the case where a pore-forming agent is not added, since pores are hardly formed in the ceramic layer, the porosity does not increase, and the decrease in the dielectric constant does not proceed. Furthermore, as is evident from Comparative Examples 2 and 3, in the case where resin beads are not coated with an inorganic substance, since huge voids are formed, insulation reliability is degraded. The reason for this is considered to be that a region in which resin beads cohere locally is generated, and degreasing gas is emitted in large quantities from that region.

REFERENCE SIGNS LIST 1, 2 multilayer ceramic substrate (ceramic electronic component)
11 ceramic layer
12, 12a, 12b internal conductor layer
13, 14 external conductor layer
15, 15a, 15b via-hole conductor
20 pore
30 shell layer (shell layer around a pore)
31 core portion
32 shell layer (shell layer around a core portion)
35 pore-forming agent

The invention claimed is:

1. A ceramic electronic component comprising: a plurality of ceramic layers which are stacked together; and an internal conductor layer disposed between two adjacent ceramic layers among the plurality of ceramic layers, wherein a ceramic layer among the plurality of ceramic layers that is adjacent to the internal conductor layer contains a plurality of pores, wherein each of the plurality of pores are each inside a shell layer, and wherein a resin is present inside the plurality of pores.

2. The ceramic electronic component according to claim 1, wherein the shell layer is formed of an inorganic substance.

3. The ceramic electronic component according to claim 2, wherein the inorganic substance contains at least $SiO_2$.

4. The ceramic electronic component according to claim 2, wherein the inorganic substance is at least one selected from the group consisting of $SiO_2$, $Al_2O_3$, $ZrO_2$, $TiO_2$, and MgO.

5. The ceramic electronic component according to claim 2, wherein the shell layer has a thickness of 0.03 μm to 0.5 μm.

6. The ceramic electronic component according to claim 1, wherein the ceramic layer among the plurality of ceramic layers that is adjacent to the internal conductor layer has a porosity of 10% to 45%.

7. The ceramic electronic component according to claim 6, wherein the porosity is 30% to 40%.

8. The ceramic electronic component according to claim 1, wherein the ceramic layer contains a glass component.

9. The ceramic electronic component according to claim 8, wherein the glass component does not contain boron.

10. The ceramic electronic component according to claim 8, wherein the glass component has a softening point of 800° C. to 950° C.

11. The ceramic electronic component according to claim 8, wherein the glass component has a softening point of 830° C. to 930° C.

12. The ceramic electronic component according to claim 8, wherein the glass component contains, as main components thereof, 47% to 67% by weight of $SiO_2$, 21% to 41% by weight of BaO, and 10% to 18% by weight of $Al_2O_3$.

13. A method for manufacturing a ceramic electronic component, the method comprising: mixing a ceramic powder, a pore-forming agent, a binder, a plasticizer, and a solvent to form a slurry, wherein the pore-forming agent has a core-shell structure including a core portion made of a resin bead which is not dissolved in the solvent and a shell layer which covers the circumference of the core portion and is formed of an inorganic substance; producing a green sheet from the slurry; forming an internal conductor layer having a conductive pattern on the green sheet; obtaining a green multilayer body by stacking and pressure-bonding a plurality of green sheets including the green sheet having the internal conductor layer formed thereon; and firing the green multilayer body so as to produce a plurality of ceramic layers which are stacked together, and the internal conductor layer is between two adjacent ceramic layers among the plurality of ceramic layers, wherein a ceramic layer among the plurality of ceramic layers that is adjacent to the internal conductor layer contains a plurality of pores, wherein each of the plurality of pores are each inside the shell layer, and wherein a resin is present inside the plurality of pores.

14. The method for manufacturing a ceramic electronic component according to claim 13, wherein the inorganic substance is at least one selected from the group consisting of $SiO_2$, $Al_2O_3$, $ZrO_2$, $TiO_2$, and MgO.

15. The method for manufacturing a ceramic electronic component according to claim 13, wherein the shell layer has a thickness of 0.03 μm to 0.5 μm.

16. The method for manufacturing a ceramic electronic component according to claim 13, wherein the resin bead contains at least one selected from acrylic resins, divinylbenzene resins, and polyimide resins.

17. The method for manufacturing a ceramic electronic component according to claim 13, wherein the ceramic powder contains a glass component.

18. The method for manufacturing a ceramic electronic component according to claim 17, wherein the glass component has a softening point of 800° C. to 950° C.

* * * * *